(12) United States Patent
Yamamoto et al.

(10) Patent No.: US 8,507,803 B2
(45) Date of Patent: Aug. 13, 2013

(54) STRUCTURE OF CONNECTING PRINTED WIRING BOARDS, METHOD OF CONNECTING PRINTED WIRING BOARDS, AND ADHESIVE HAVING ANISOTROPIC CONDUCTIVITY

(75) Inventors: Masamichi Yamamoto, Osaka (JP); Kyouichirou Nakatsugi, Osaka (JP); Ayao Kariya, Osaka (JP); Katsuhiro Satou, Osaka (JP); Yasuhiro Okuda, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 310 days.

(21) Appl. No.: 12/722,810

(22) Filed: Mar. 12, 2010

(65) Prior Publication Data

US 2010/0230141 A1  Sep. 16, 2010

(30) Foreign Application Priority Data

Mar. 13, 2009  (JP) .................................. 2009-061453

(51) Int. Cl.
*H05K 1/03* (2006.01)

(52) U.S. Cl.
USPC ........... 174/255; 174/250; 174/259; 174/260; 174/262; 174/264; 361/794; 29/829; 29/832; 29/840; 29/852; 438/107; 438/644; 523/466; 264/71; 257/69; 257/777; 257/778; 257/783; 257/787

(58) Field of Classification Search
USPC ................. 174/255, 250, 259, 260, 262, 264; 361/794; 29/829, 832, 840, 852; 438/107, 438/644; 523/466; 264/71; 257/69, 777, 257/778, 783, 787
See application file for complete search history.

(56) References Cited

U.S. PATENT DOCUMENTS

| | | | | |
|---|---|---|---|---|
| 5,346,750 | A | * | 9/1994 | Hatakeyama et al. ......... 428/209 |
| 5,481,795 | A | * | 1/1996 | Hatakeyama et al. .......... 29/852 |
| 5,611,884 | A | * | 3/1997 | Bearinger et al. ............. 156/325 |
| 5,769,996 | A | * | 6/1998 | McArdle et al. ............ 156/272.4 |
| 6,034,331 | A | * | 3/2000 | Tsukagoshi et al. .......... 174/250 |
| 6,077,382 | A | * | 6/2000 | Watanabe ..................... 156/322 |

(Continued)

FOREIGN PATENT DOCUMENTS

| | | |
|---|---|---|
| JP | 7-90237 A | 4/1995 |
| JP | H10-261852 A | 9/1998 |

(Continued)

*Primary Examiner* — Xiaoliang Chen
(74) *Attorney, Agent, or Firm* — Drinker Biddle & Reath LLP

(57) ABSTRACT

The invention offers a board-connecting structure that can provide electrodes with a fine pitch and that can combine the insulating property and the connection reliability. The structure of connecting printed wiring boards 10 and 20 electrically connects a plurality of first electrodes 12 and 13 provided to be adjacent to each other on a first board 11 with a plurality of second electrodes 22 and 23 provided to be adjacent to each other on a second board 21 through an adhesive 30 that contains conductive particles 31 and that has anisotropic conductivity. By heating and pressing the adhesive placed between the mutually facing first electrode 12 and second electrode 22 and between the mutually facing first electrode 13 and second electrode 23, an adhesive layer 30*a* is formed between the first board 11 and the second board 21 and in the adhesive layer 30*a*, a cavity portion 33 is formed between the first electrodes 12 and 13 and between the second electrodes 22 and 23.

7 Claims, 7 Drawing Sheets

(56) References Cited

U.S. PATENT DOCUMENTS

| | | | |
|---|---|---|---|
| 6,110,399 A * | 8/2000 | McArdle et al. | 252/513 |
| 6,338,195 B1 * | 1/2002 | Tsukagoshi et al. | 29/832 |
| 6,467,139 B1 * | 10/2002 | Tanaka | 29/25.35 |
| 6,479,763 B1 * | 11/2002 | Igaki et al. | 174/262 |
| 6,815,830 B2 * | 11/2004 | Miyasaka | 257/778 |
| 6,940,180 B1 * | 9/2005 | Uchiyama | 257/783 |
| 7,084,517 B2 * | 8/2006 | Uchiyama | 257/783 |
| 7,259,207 B2 * | 8/2007 | Gruenewaelder et al. | 524/590 |
| 7,524,910 B2 * | 4/2009 | Jiang et al. | 526/348 |
| 7,820,742 B2 * | 10/2010 | Ichiroku et al. | 523/466 |
| 2002/0158232 A1 * | 10/2002 | Mitani et al. | 252/500 |
| 2003/0102154 A1 | 6/2003 | Haba | |
| 2003/0178132 A1 * | 9/2003 | Shinozaki | 156/275.5 |
| 2004/0195569 A1 * | 10/2004 | Hashimoto et al. | 257/69 |
| 2005/0035465 A1 * | 2/2005 | Miyasaka | 257/778 |
| 2005/0056948 A1 * | 3/2005 | Uchiyama | 257/783 |
| 2006/0065995 A1 * | 3/2006 | Masaki et al. | 264/71 |
| 2007/0001313 A1 * | 1/2007 | Fujimoto et al. | 257/778 |
| 2007/0069984 A1 * | 3/2007 | Kim et al. | 345/60 |
| 2007/0094872 A1 * | 5/2007 | Konishi et al. | 29/840 |
| 2007/0182019 A1 * | 8/2007 | Nishimura | 257/777 |
| 2007/0215838 A1 * | 9/2007 | Toshioka et al. | 252/500 |
| 2008/0165518 A1 | 7/2008 | Ichiryu et al. | |
| 2009/0000807 A1 * | 1/2009 | Han et al. | 174/250 |
| 2009/0008776 A1 | 1/2009 | Kitae et al. | |
| 2009/0068916 A1 * | 3/2009 | Jang et al. | 445/24 |
| 2009/0175019 A1 | 7/2009 | Koyama et al. | |
| 2009/0230568 A1 * | 9/2009 | Yasuda et al. | 257/787 |
| 2009/0311827 A1 * | 12/2009 | Ishizawa et al. | 438/107 |
| 2010/0206623 A1 * | 8/2010 | Kawate et al. | 174/259 |
| 2010/0221968 A1 * | 9/2010 | Wihlsson | 442/180 |

FOREIGN PATENT DOCUMENTS

| | | |
|---|---|---|
| JP | 2000-183518 A | 6/2000 |
| JP | 3622792 B | 12/2004 |
| JP | 2007-95763 A | 4/2007 |
| JP | 2007-173477 A | 7/2007 |
| JP | 2007-250825 | 9/2007 |
| JP | 2009-1604 A | 1/2009 |
| JP | 2009-4614 A | 1/2009 |
| WO | 2006/103949 | 10/2006 |
| WO | WO 2006/103948 A1 | 10/2006 |
| WO | WO 2008/114546 A1 | 9/2008 |
| WO | WO 2008/139701 | 11/2008 |

* cited by examiner

STRUCTURE OF CONNECTING PRINTED WIRING BOARDS, METHOD OF CONNECTING PRINTED WIRING BOARDS, AND ADHESIVE HAVING ANISOTROPIC CONDUCTIVITY

FIELD OF THE INVENTION

1. Field of the Invention

The present invention relates to a structure of connecting printed wiring boards in which electrodes provided to be adjacent to each other on two boards are electrically connected mutually through an adhesive having anisotropic conductivity, to a method of connecting printed wiring boards, and to an adhesive having anisotropic conductivity.

2. Background Art

In recent years, in the field of electronic apparatus, printed wiring boards have been widely used in various applications as electronic apparatuses come to have a high density, a miniature size, and so on. In this field, a wiring-board-bonded body is known in which two printed wiring boards are bonded together through adhesive. In addition, as the structure of connecting printed wiring boards included in a wiring-board-bonded body, a structure is known in which two printed wiring boards are connected together through an adhesive having anisotropic conductivity, that is, an anisotropically conductive adhesive.

More specifically, for example, as shown in FIG. 8, a structure of connecting printed wiring boards is known that electrically connects a plurality of first electrodes 112 and 113 provided to be adjacent to each other on a first board 111 with a plurality of second electrodes 122 and 123 provided to be adjacent to each other on a second board 121 through an adhesive 130 that contains conductive particles 131 and that has anisotropic conductivity.

In recent years, on the other hand, the providing of the electrodes with a fine pitch has been advanced. This advancement has required the improvement of the insulating property between the electrodes provided to be adjacent to each other. As the structure for improving the insulating property between the electrodes, for example, a structure of connecting the boards has been disclosed in which a protruding insulating member is formed between the electrodes (see Patent literature 1, for example).

PRIOR-ART LITERATURE

Patent Literature

Patent literature 1: the published Japanese patent application Tokukai 2007-250825.

SUMMARY OF THE INVENTION

Despite the above description, when a protruding insulating member is formed between the electrodes as stated in Patent literature 1 described above, there has been a problem in that, although the insulating property can be improved, it is difficult to form a small protruding insulating member, so that it is impossible to realize the providing of a plurality of metal electrodes with a fine pitch by decreasing the distance between them.

In addition, there has been a problem in that, when the number of conductive particles included in the adhesive is decreased, although the insulating property between the electrodes provided to be adjacent to each other can be improved, the reliability in electrical connection between the mutually facing electrodes to be connected (for example, the first electrode 112 and the second electrode 122) is decreased, so that it is difficult to combine the insulating property and the connection reliability.

The present invention is made in view of the above-described problems. An object of the present invention is to offer a structure of connecting printed wiring boards, the structure being capable of realizing not only the providing of electrodes with a fine pitch but also combining the insulating property and the connection reliability, a method of connecting printed wiring boards, and an adhesive having anisotropic conductivity.

The present invention offers a structure of connecting printed wiring boards. The structure electrically connects a plurality of first electrodes provided to be adjacent to each other on a first board with a plurality of second electrodes provided to be adjacent to each other on a second board through an adhesive that contains conductive particles and that has anisotropic conductivity. The structure has the following features:

(a) the adhesive is placed between the first electrodes and the second electrodes, which face each other,
(b) the adhesive is heated and pressed to form an adhesive layer between the first board and the second board, and
(c) in the adhesive layer, a cavity portion is formed between the multiple first electrodes and between the multiple second electrodes.

According to the above-described structure, in the adhesive layer formed between the first board and the second board, the cavity portion is formed between the multiple first electrodes and between the multiple second electrodes. This structure can improve the insulating property between the first electrodes and between the second electrodes, without providing, for example, a protruding insulating member between the first electrodes and between the second electrodes. As a result, the multiple first electrodes and second electrodes can be provided with a fine pitch. Furthermore, because the above-described cavity portion is formed in the adhesive layer, the conductive particles included in the adhesive are likely to gather in the location between the first electrodes provided on the first board and the second electrodes provided on the second board. Consequently, the reliability in electrical connection between the first electrodes and the second electrodes can be improved. As a result, this structure can combine the insulating property and the connection reliability.

In the above-described structure of the present invention, the structure may have the feature described below. In a cross section obtained by cutting, in a direction perpendicular to the thickness direction, the region between the first electrodes and the second electrodes, which face each other in the thickness direction of the first board and the second board, when A1 represents the total area of the adhesive layer and the cavity portion both existing between the electrodes provided to be adjacent to each other along a surface direction, which is perpendicular to the thickness direction and A2 represents the area of the cavity portion, the ratio of the area of the cavity portion to the total area, which is A2/A1, is 0.3 or more and 0.9 or less. In the above description, the expression "between the electrodes provided to be adjacent to each other" means not only "between the multiple first electrodes along the surface direction" but also "between the multiple second electrodes along the surface direction."

When the above-described structure is employed, to the total area of the adhesive layer and the cavity portion both existing between the electrodes provided to be adjacent to each other in the cross section perpendicular to the thickness direction, the area of the cavity portion in the adhesive layer has a ratio of 0.3 or more. Therefore, a large proportion of area is occupied by the cavity portion in the area between the electrodes provided to be adjacent to each other along the surface direction. As a result, this structure can reliably improve the insulating property between the first electrodes and between the second electrodes. In addition, to the total area of the adhesive layer and the cavity portion both existing between the electrodes provided to be adjacent to each other in the cross section perpendicular to the thickness direction, the area of the cavity portion in the adhesive layer has a ratio of 0.9 or less. Therefore, a large proportion of area is occupied by the adhesive in the area between the electrodes provided to be adjacent to each other along the surface direction. As a result, this structure can secure the bonding property between the first board and the second board.

In the above-described structure of the present invention, the first electrodes may have a pitch between them of 10 μm or more and 300 μm or less and the second electrodes may have a pitch between them of 10 μm or more and 300 μm or less. In the above description, the pitch between the first electrodes has a length formed by adding the width of one of the first electrodes and the spacing between the neighboring two first electrodes. Similarly, the pitch between the second electrodes has a length formed by adding the width of one of the second electrodes and the spacing between the neighboring two second electrodes.

When the above-described structure is employed, the pitch between the first electrodes and the pitch between the second electrodes are 300 μm or less. As a result, the multiple first electrodes and second electrodes can be provided with a fine pitch, so that the electrodes on the individual printed wiring boards can be provided with high density. Furthermore, because the pitch between the first electrodes and the pitch between the second electrodes are 10 μm or more, this structure can secure the width of the electrodes and the spacing between the neighboring two electrodes.

In the above-described structure of the present invention, the adhesive may not only cover the first electrodes and the second electrodes but also cover the first board and the second board at the positions between the first electrodes and between the second electrodes.

When the above-described structure is employed, the adhesive not only covers the first electrodes and the second electrodes but also covers the first board and the second board at the positions between the first electrodes and between the second electrodes. As a result, this structure can sufficiently secure the bonding property of the first board and the first electrodes with the second board and the second electrodes.

In the above-described structure of the present invention, the conductive particles may constitute 0.0001 vol. % or more and 0.2 vol. % or less of the total volume of the adhesive.

When the above-described structure is employed, the conductive particles constitute 0.0001 vol. % or more and 0.2 vol. % or less of the total volume of the adhesive. In other words, the concentration of the conductive particles is low. This low concentration can improve the insulating property between the first electrodes and between the second electrodes.

In the above-described structure of the present invention, the conductive particles may be a metal powder whose individual particle has either a shape in which a large number of fine metal particles are linked in the form of a linear chain or a needlelike shape and the conductive particles each may have an aspect ratio of 5 or more.

When the above-described structure is employed, the conductive particles are a metal powder whose individual particle has either a shape in which a large number of fine metal particles are linked in the form of a linear chain or a needlelike shape. Consequently, while securing the insulating property between the first electrodes and between the second electrodes, this structure can facilitate the electrical connection of the first electrodes with the second electrodes. In addition, the conductive particles each have an aspect ratio of 5 or more. This feature increases the probability of contact between the conductive particles. This condition can improve the connection reliability between the first electrodes and the second electrodes without increasing the quantity of use of the conductive particles.

In the above-described structure of the present invention, the adhesive may have the shape of a film and the direction of the length of the major axis of the conductive particles may be oriented toward the thickness direction of the adhesive, which has the shape of a film.

When the above-described structure is employed, the adhesive has the shape of a film. This feature not only facilitates the handling of the adhesive but also improves the workability at the time the adhesive layer is formed between the first board and the second board through the heating and pressing of the adhesive. In addition, the direction of the length of the major axis of the conductive particles is oriented toward the thickness direction of the adhesive, which has the shape of a film. Consequently, while securing the insulating property between the first electrodes and between the second electrodes, this structure can further facilitate the electrical connection of the first electrodes with the second electrodes.

In the above-described structure of the present invention, the adhesive may have thermosetting property and a melt viscosity of 10 Pa·s or more and 10,000 Pa·s or less at 100° C.

When the above-described structure is employed, because the adhesive has a melt viscosity of 10,000 Pa·s or less at 100° C., when the adhesive layer is formed by heating and pressing the adhesive, the gas bubble tends to grow in the adhesive, so that a large cavity portion is likely to be formed. In addition, because the adhesive has a melt viscosity of 10 Pa·s or more at 100° C., when the adhesive layer is formed by heating and pressing the adhesive, the gas forming the cavity portion is less likely to escape from the interior of the adhesive. Consequently, when the heating and pressing are performed on the adhesive placed between the first electrodes and the second electrodes, this structure can facilitate the formation of the cavity portion in the adhesive layer.

In the above-described structure of the present invention, the structure may have the following features:

(a) the adhesive contains, as essential constituents, epoxy resin, phenoxy resin, a curing agent, and conductive particles, (b) the epoxy resin is a liquid epoxy resin having a viscosity of 0.1 Pa·s or more and 150 Pa·s or less at 25° C., and (c) the liquid epoxy resin constitutes 30 mass % or more and 50 mass % or less of the total amount of the constituents of the adhesive.

The adhesive having the foregoing composition becomes a suitable adhesive that can facilitate the forming of the cavity portion in the adhesive layer. As a result, the adhesive can offer good insulating property between the first electrodes and between the second electrodes even in a high-temperature, high-humidity environment.

As an aspect of the present invention, the present invention offers a method of connecting printed wiring boards. The method electrically connects a plurality of first electrodes provided to be adjacent to each other on a first board with a plurality of second electrodes provided to be adjacent to each other on a second board through an adhesive that contains conductive particles and that has anisotropic conductivity. The method has the following features:

(a) the adhesive is placed between the first electrodes and the second electrodes, which face each other, (b) the adhesive is heated and pressed to form an adhesive layer between the first board and the second board, and (c) at the same time, in the adhesive layer, a cavity portion is formed between the multiple first electrodes and between the multiple second electrodes.

When the above-described method is employed, in the adhesive layer formed between the first board and the second board, the cavity portion is formed between the multiple first electrodes and between the multiple second electrodes. This structure can improve the insulating property between the first electrodes and between the second electrodes, without providing, for example, a protruding insulating member between the first electrodes and between the second electrodes. As a result, the multiple first electrodes and second electrodes can be provided with a fine pitch. Furthermore, because the above-described cavity portion is formed in the adhesive layer, the conductive particles included in the adhesive are likely to gather in the location between the first electrodes provided on the first board and the second electrodes provided on the second board. Consequently, the reliability in electrical connection between the first electrodes and the second electrodes can be improved. As a result, this structure can combine the insulating property and the connection reliability. In addition, because the cavity portion is formed in the adhesive layer concurrently with the formation of the adhesive layer, this method can eliminate the necessity of another step for forming the cavity portion in the adhesive layer.

As another aspect of the present invention, the present invention offers an adhesive that has anisotropic conductivity and that is used in the structure of connecting printed wiring boards. The adhesive has either thermosetting property and a melt viscosity of 10 Pa·s or more and 10,000 Pa·s or less at 100° C. or the following features:

(a) the adhesive contains, as essential constituents, epoxy resin, phenoxy resin, a curing agent, and conductive particles, (b) the epoxy resin is a liquid epoxy resin having a viscosity of 0.1 Pa·s or more and 150 Pa·s or less at 25° C., and (c) the liquid epoxy resin constitutes 30 mass % or more and 50 mass % or less of the total amount of the constituents of the adhesive.

Consequently, the adhesive can be suitably used to concurrently form the cavity portion in the adhesive layer between the multiple first electrodes and between the multiple second electrodes at the time the adhesive layer is formed between the first board and the second board.

The present invention enables the structure to provide the electrodes with a fine pitch and to combine the insulating property and the connection reliability.

DETAILED DESCRIPTION OF THE PREFERRED EMBODIMENTS

Figure 1:
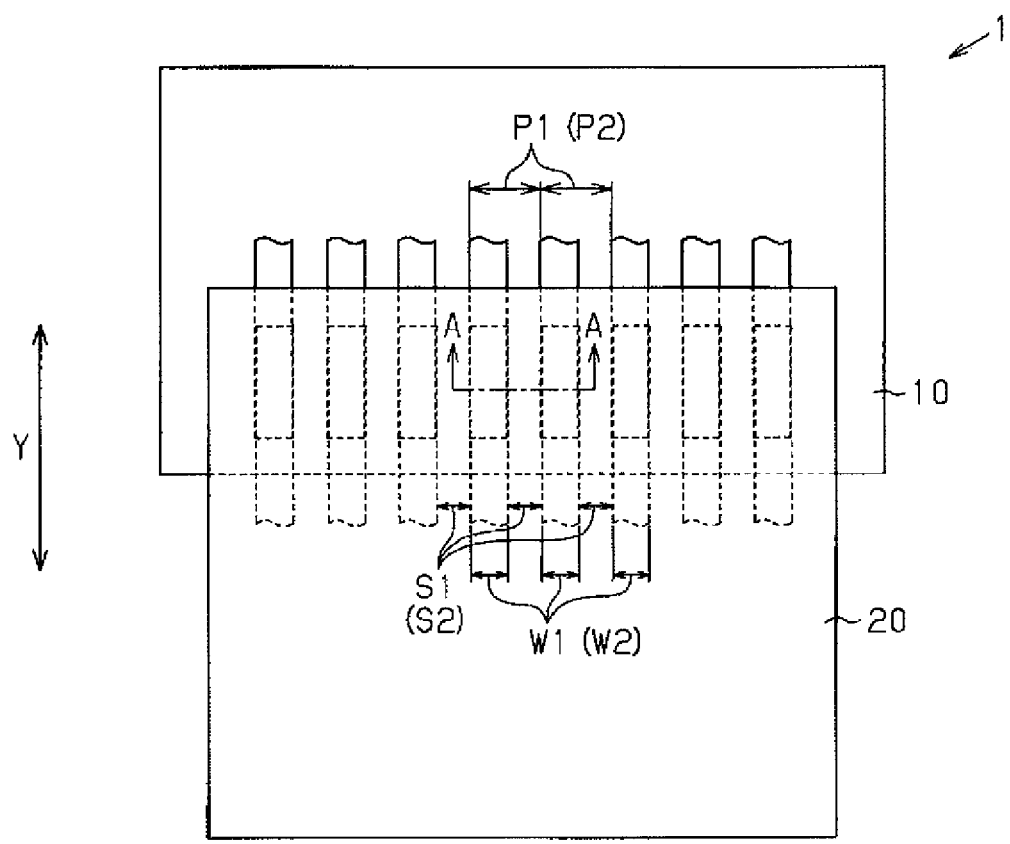
FIG. 1 is a diagram showing a bonded body of printed wiring boards in an embodiment of the present invention, the wiring-board-bonded body being viewed from a direction perpendicular to the surface direction.
Figure 2:
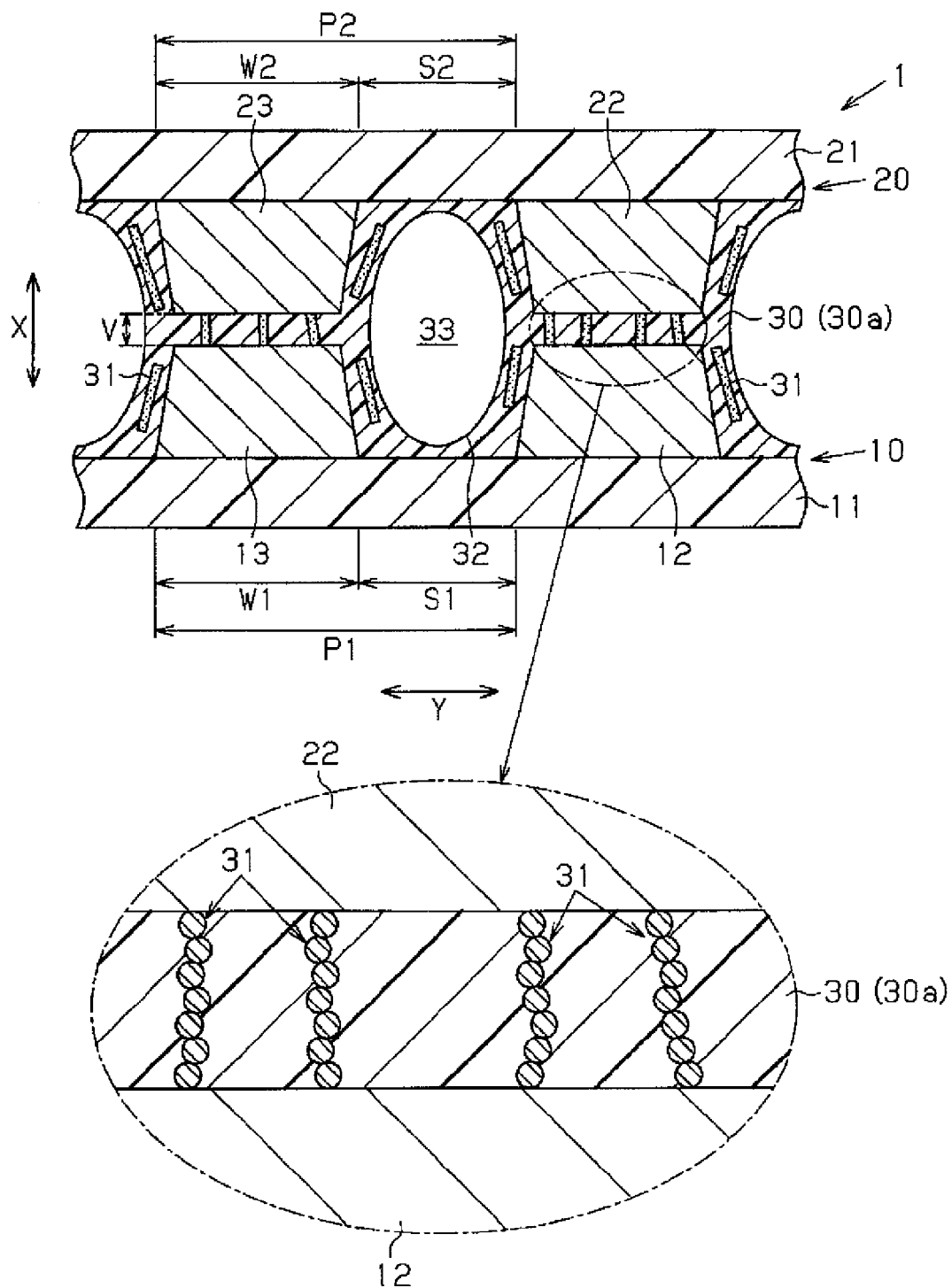
FIG. 2 is a cross-sectional view showing the structure of connecting printed wiring boards in an embodiment of the present invention, the view showing a cross section obtained by cutting the wiring-board-bonded body in the direction perpendicular to the surface direction.
Figure 4:
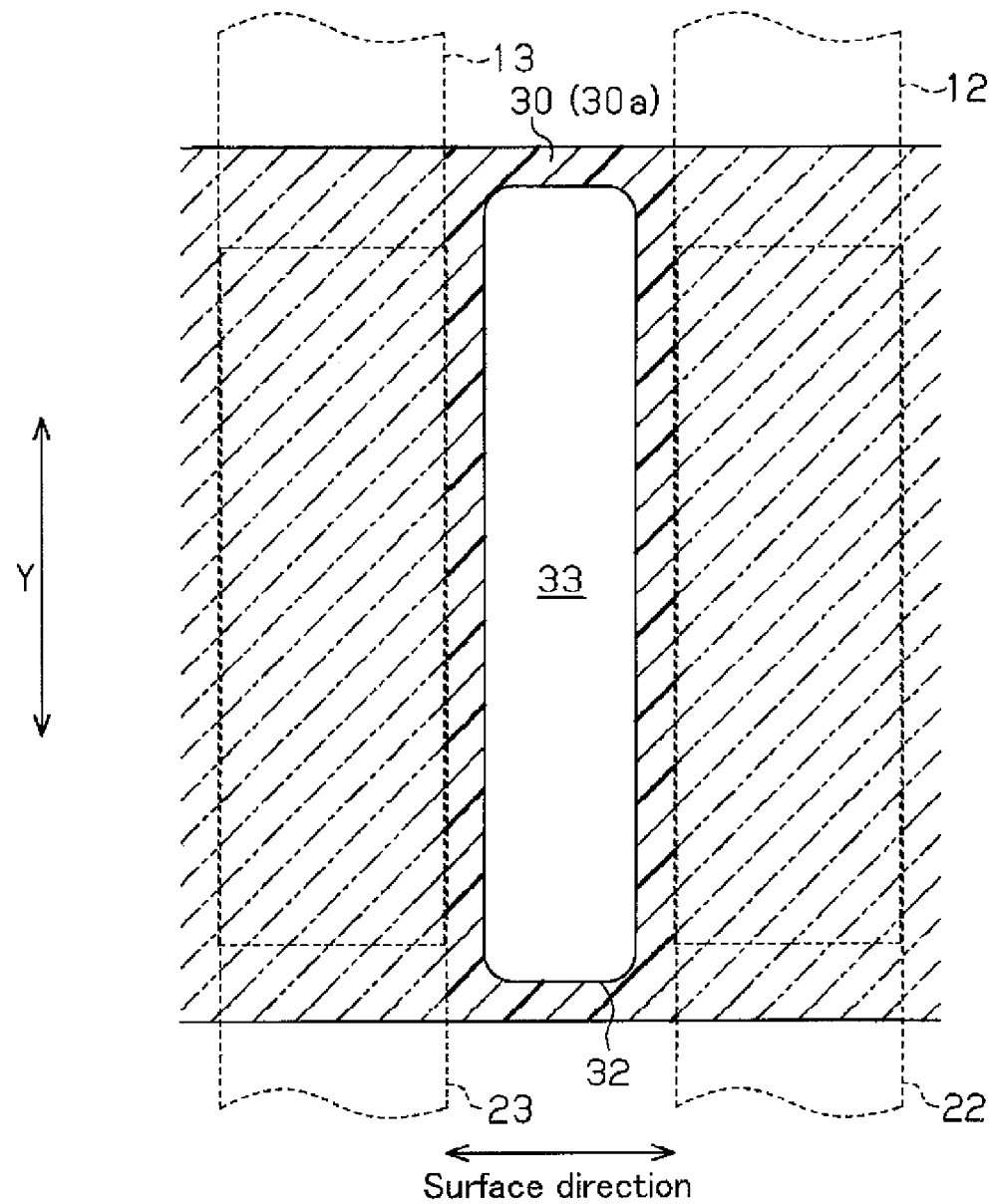
FIG. 4 is a cross-sectional view showing the structure of connecting printed wiring boards in an embodiment of the present invention, the view showing a cross section obtained by cutting the wiring-board-bonded body in the direction perpendicular to the thickness direction.

The preferred embodiments of the present invention are explained below. FIG. 1 is a diagram showing the configuration of a wiring-board-bonded body having a structure of connecting printed wiring boards of the present invention. FIG. 2 is a diagram showing a cross section obtained by cutting a wiring-board-bonded body 1 in the direction perpendicular to the surface direction, the diagram showing the A-A cross section shown in FIG. 1. The double-headed arrows X and Y in the diagram denote the thickness direction and a surface direction, respectively. In FIGS. 1 and 4, the double-headed arrow Y denoting a surface direction shows the direction to which the electrodes are extended. In this embodiment, an explanation is given to, as an example, a wiring-board-bonded body in which two flexible wiring boards are bonded together.

As shown in FIG. 1, the wiring-board-bonded body 1 formed through the present invention is a bonded body in which a first printed wiring board 10, which is a flexible wiring board, and a second printed wiring board 20, which is a flexible wiring board, are bonded together through an adhesive 30 having anisotropic conductivity (see FIG. 2). By bonding (connecting) the first printed wiring board 10 and the second printed wiring board 20 together through the adhesive 30, which is an anisotropically conductive adhesive, a plurality of electrodes (shown by broken lines in FIG. 1) included in the individual printed wiring boards 10 and 20 are electrically connected. The structure of the individual printed wiring boards 10 and 20 is concretely explained below.

As shown in FIG. 2, the first printed wiring board 10 is provided with a first board 11 and a plurality of first electrodes 12 and 13 placed on the first board 11. The first electrodes 12 and 13 are placed to be adjacent to each other along a surface direction Y (i.e., the direction perpendicular to the thickness direction X). Similarly, the second printed wiring board 20 is provided with a second board 21 and a plurality of second electrodes 22 and 23 placed on the second board 21. The second electrodes 22 and 23 are placed to be adjacent to each other along the surface direction Y.

In a state where the first printed wiring board 10 and the second printed wiring board 20 are bonded together, the first electrode 12 and the second electrode 22 face each other in the thickness direction X and the first electrode 13 and the second electrode 23 face each other in the thickness direction X.

The individual boards 11 and 21 may be formed by using a resinous material having excellent flexibility. In other words, the individual boards 11 and 21 may be formed by using a resin having general versatility for the printed wiring board, such as polyimide or polyester. In particular, it is desirable that the resin have high heat resistance in addition to the flexibility. The types of the foregoing resin include a polyamide-based resin and a polyimide-based resin such as polyimide and polyamideimide; they can be used suitably.

The individual electrodes 12, 13, 22, and 23 are metal electrodes formed by using metal such as copper. For example, they can be formed by processing metal foil such as copper foil through etching using an established process. In addition, the individual electrodes 12, 13, 22, and 23 can also be formed through a plating process using a semi-additive process.

In this embodiment, the individual electrodes 12, 13, 22, and 23 are formed such that the pitch P1 between the first electrodes and the pitch P2 between the second electrodes become, for example, 10 μm or more and 300 μm or less. The pitch P1 between the first electrodes has a length formed by adding the width W1 of one of the first electrodes (i.e., the first electrode 12 or the first electrode 13) and the spacing S1 between the neighboring two first electrodes 12 and 13. Consequently, for example, when the width W1 of the individual first electrodes 12 and 13 is 50 μm and the spacing S1 between the first electrodes 12 and 13 is 50 μm, the pitch P1 between the first electrodes is 100 μm. Similarly, the pitch P2 between the second electrodes has a length formed by adding the width W2 of one of the second electrodes (i.e., the second electrode 22 or the second electrode 23) and the spacing S2 between the neighboring two second electrodes 22 and 23. In this embodiment, the width W1 and the width W2 have the same magnitude and the spacing S1 and the spacing S2 have the same magnitude. Therefore, the pitch P1 between the first electrodes is equal to the pitch P2 between the second electrodes.

The adhesive 30 is an anisotropically conductive adhesive that contains conductive particles 31 and that has anisotropic conductivity. The adhesive 30 is a thermosetting adhesive containing, as essential constituents, epoxy resin; phenoxy resin, which is a high-molecular-weight epoxy resin; a curing agent; and the conductive particles 31. The adhesive 30 is bonded to the first printed wiring board 10 and the second printed wiring board 20. More specifically, the adhesive 30 is not only bonded to the first electrodes 12 and 13 and the second electrodes 22 and 23 but also bonded to the first board 11 and the second board 21.

The adhesive 30 may be prepared, for example, by using epoxy resin and phenoxy resin, both of which are an insulating thermosetting resin, as the main constituents into which the conductive particles 31, made of nickel, copper, silver, gold, or the like, are dispersed. By using epoxy resin, the adhesive 30 can improve the film formability, heat resistance, and bonding strength.

The adhesive 30 may contain epoxy resin such as a bisphenol-A-type epoxy resin, a bisphenol-F-type epoxy resin, a bisphenol-S-type epoxy resin, a bisphenol-AD-type epoxy resin, a bisphenol-A-type—bisphenol-F-type—copolymer-type epoxy resin, a naphthalene-type epoxy resin, a novolak-type epoxy resin, a biphenyl-type epoxy resin, or a dicyclopentadiene-type epoxy resin. The adhesive 30 is required only to contain at least one type of the above-described epoxy resins.

The molecular weight of the epoxy resin and phenoxy resin may be selected as appropriate considering the performance required to the adhesive 30. For example, when a high-molecular-weight epoxy resin is used, the film formability can be increased and the melt viscosity of the resin at the connecting temperature can be increased, so that the connecting operation can be performed without disturbing the later-described orientation of the conductive particles. On the other hand, when a low-molecular-weight epoxy resin is used, the cross-linking density is increased, so that the heat resistance can be increased. In addition, at the time of heating, the resin reacts with the above-described curing agent promptly, so that the bonding performance can be enhanced. Consequently, it is desirable to use a high-molecular-weight epoxy resin having a molecular weight of 15,000 or more and a low-molecular-weight epoxy resin having a molecular weight of 2,000 or less in combination in order to achieve a balance in performance. The quantity of use of the high-molecular-weight epoxy resin and the low-molecular-weight epoxy resin may be selected as appropriate. The term "molecular weight" is used to mean the weight average molecular weight in terms of polystyrene standard obtained from the gel permeation chromatography (GPC) dissolved in THF.

The adhesive 30 contains a latent curing agent as the curing agent. The containing of the curing agent for promoting the curing of the epoxy resin enables the achievement of high bonding strength. The latent curing agent has excellent storage stability at low temperatures, so that it almost does not give rise to a curing reaction at room temperature. Nevertheless, it promptly initiates the curing reaction with the aid of heat, light, or the like. The types of such a latent curing agent include an imidazole-based agent; a hydrazide-based agent; an amine-based agent such as a boron trifluoride-amine complex, amineimide, a polyamine-based agent, tertiary amine, and an alkylurea-based agent; a dicyandiamide-based agent; an acid anhydride-based agent; a phenol-based agent; and a modified material of these. They may be used singly or as a mixture of at least two types of these.

Among the foregoing latent curing agents, it is desirable to use an imidazole-based latent curing agent in view of excellent storage stability at low temperatures and promptly curing property. As the imidazole-based latent curing agent, a well-known imidazole-based latent curing agent may be used. More specifically, an adduct compound of an imidazole compound with an epoxy resin can be shown as an example. The types of imidazole compound include imidazole, 2-methylimidazole, 2-ethylimidazole, 2-propylimidazole, 2-dodecylimidazole, 2-phenylimidazole, 2-phenyl-4-methylimidazole, and 4-methylimidazole.

In particular, it is desirable that these latent curing agents be covered with a polymeric material such as a polyurethane-based material or a polyester-based material; a metal film made of nickel, copper, or the like; or an inorganic substance such as calcium silicate to form a microcapsule, because the microcapsule can combine the mutually contradictory properties of the long-term storability and the promptly curing property. Consequently, it is particularly desirable to use a microcapsule-type imidazole-based latent curing agent.

Figure 3:
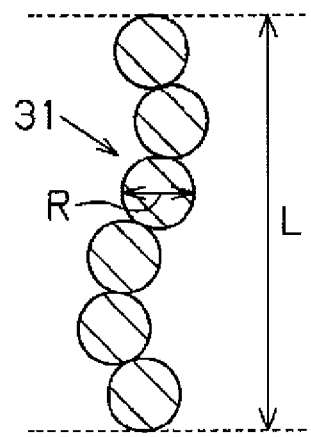
FIG. 3 is a vertical sectional view showing one of the conductive particles contained in an adhesive in an embodiment of the present invention.

The adhesive 30, which is an anisotropically conductive adhesive, contains dispersed conductive particles 31. The conductive particles 31 are formed of a metal powder whose individual particle has a shape with a large so-called aspect ratio, the shape being either a shape in which a large number of fine metal particles are linked in the form of a linear chain or a needlelike shape. In the above description, the term "fine metal particles" means, for example, fine spherical metal particles or fine metallic particles formed by plating spherical resinous particles with metal. Furthermore, in the above description, the term "aspect ratio" is used to mean the ratio L/R (see FIG. 3), where L denotes the length of the major axis of one of the conductive particles 31 (the length of one of the conductive particles 31) and R denotes the length of the minor axis of it (the maximum width of the cross section of one of the conductive particles 31). In this embodiment, the conductive particles 31 constitute 0.0001 vol. % or more and 0.2 vol. % or less of the total volume of the adhesive 30.

The adhesive 30 is placed between the first board 11 and the second board 21 and between the first electrodes 12 and 13 and the second electrodes 22 and 23. When treated by heating and pressing, the adhesive 30 is first melted and then cured. Through this procedure, the adhesive 30 forms an adhesive layer 30a between the first printed wiring board 10 and the second printed wiring board 20.

As described above, the structure of the present invention for connecting the printed wiring boards 10 and 20 electrically connects the multiple first electrodes 12 and 13 provided to be adjacent to each other on the first board 11 with the multiple second electrodes 22 and 23 provided to be adjacent to each other on the second board 21 through the adhesive 30 that contains the conductive particles 31 and that has anisotropic conductivity.

This embodiment has a feature in that by, first, placing the adhesive 30 between the mutually facing first electrodes 12 and 13 and second electrodes 22 and 23 and, then, heating and pressing the adhesive 30, the adhesive layer 30a is formed between the first board 11 and the second board 21 and in the adhesive layer 30a, a cavity portion 33 is formed between the multiple first electrodes 12 and 13 and between the multiple second electrodes 22 and 23. This structure can improve the insulating property between the first electrodes 12 and 13 and between the second electrodes 22 and 23, without providing a protruding insulating member (not shown) between the first electrodes 12 and 13 and between the second electrodes 22 and 23, which has been conventionally provided.

More specifically, in the place between the first electrodes 12 and 13, between the second electrodes 22 and 23, and between the first board 11 and the second board 21, a gas bubble 32 whose interior forms the cavity portion 33 is formed in the adhesive layer 30a, which is formed by the adhesive 30. The cavity portion 33 is not a space formed by a gas contained in the additive 30 before it is treated by heating and pressing as described above but a space formed by a gas having intruded into the additive 30 at the time the first printed wiring board 10 and the second printed wiring board 20 are connected to each other through the above-described heating and pressing treatment. Consequently, the gas forming the gas bubble 32, i.e., the gas included in the cavity portion 33, is different depending on the production condition for the wiring-board-bonded body 1. For example, the gas included in the cavity portion 33 is composed of air, nitrogen, or a noble gas.

The cavity portion 33 is formed continuously along the direction in which the individual electrodes 12, 13, 22, and 23 are extended. In other words, the cavity portion 33 extends along the direction in which the electrodes are extended (the direction is shown by the double-headed arrow Y in FIG. 1). In a cross section obtained by cutting the bonded portion in the direction perpendicular to the thickness direction X, the cavity portion 33, which extends along the direction in which the electrodes are extended as described above, has an area that has a predetermined ratio to the total area between the electrodes provided to be adjacent to each other.

More specifically, in a cross section (see FIG. 4) obtained by cutting the region between the first electrodes 12 and 13 and the second electrodes 22 and 23, which face each other in the thickness direction X of the first board 11 and the second board 21, (the foregoing region is the region shown by the double-headed arrow V in FIG. 2), when A1 represents the total area of the adhesive layer 30a (the solid-line-hatched portion) and the cavity portion 33 both existing between the electrodes provided to be adjacent to each other along the surface direction and A2 represents the area of the cavity portion 33, the ratio of the area of the cavity portion 33 to the total area, which is A2/A1, is 0.3 or more and 0.9 or less. In the above description, the expression "between the electrodes provided to be adjacent to each other along the surface direction" means not only "between the first electrodes 12 and 13" but also "between the second electrodes 22 and 23."

As described above, the total area of the adhesive layer 30a and the cavity portion 33 is the area of the region in which the first board 11 and the second board 21 are bonded together through the adhesive 30; the area is equal to the total area between the electrodes provided to be adjacent to each other along the surface direction, which is perpendicular to the thickness direction X. In a cross section obtained by cutting the region between the first electrodes 12 and 13 and the second electrodes 22 and 23, which face each other in the thickness direction X of the first board 11 and the second board 21, the ratio of the area of the adhesive layer 30a between the electrodes provided to be adjacent to each other along the surface direction to the area of the cavity portion 33 is in the range of 7:3 to 1:9.

When a plurality of cavity portions 33 exist in the adhesive layer 30a between the first board 11 and the second board 21, between the first electrodes 12 and 13, and between the second electrodes 22 and 23, the foregoing area of the cavity portion 33 in the above-described cross section is the total area of the multiple cavity portions 33.

In this embodiment, the adhesive 30, which has thermosetting property, has a melt viscosity of 10 Pa·s or more and 10,000 Pa·s or less at 100° C. When such a property is given, at the time the adhesive layer 30a is formed by heating and pressing the adhesive 30, the gas bubble 32 tends to grow in the adhesive 30, so that a large cavity portion 33 is likely to be formed. In addition, the gas forming the cavity portion 33 is less likely to escape from the interior of the adhesive 30. To increase the above-described effect, it is desirable that the adhesive 30 have a melt viscosity of 100 Pa·s or more and 10,000 Pa·s or less at 100° C. To further increase the above-described effect, it is more desirable to realize the viscosity of 1,000 Pa·s or more and 10,000 Pa·s or less. The melt viscosity of the adhesive 30 can be measured by using, for example, a rheometer (not shown), which is a viscosity-measuring device capable of measuring the viscosity of a semisolid substance in addition to that of a liquid.

In this embodiment, to obtain an adhesive 30 having a melt viscosity of 10 Pa·s or more and 10,000 Pa·s or less at 100° C., the adhesive 30 contains, as the epoxy resin, a liquid epoxy resin that has a viscosity of 0.1 Pa·s or more and 150 Pas or less at 25° C. and that constitutes 30 mass % or more and 50 mass % or less of the total amount of the constituents. The liquid epoxy resin having a viscosity of 0.1 Pa·s or more and 150 Pa·s or less at 25° C. can be obtained by using, for example, a bisphenol-A-type epoxy resin, a bisphenol-F-type epoxy resin, a dicyclopentadiene-type epoxy resin, or a naphthalene-type epoxy resin.

In this embodiment, the adhesive 30 not only covers the first electrodes 12 and 13 and the second electrodes 22 and 23 but also covers the first board 11 and the second board 21 at the positions between the first electrodes 12 and 13 and between the second electrodes 22 and 23. In other words, this embodiment has a structure in which the cavity portion 33 is not formed on the surfaces of the first board 11, the second board 21, the first electrodes 12 and 13, and the second electrodes 22 and 23.

It is desirable that the conductive particles 31 each have an aspect ratio of 5 or more. The use of the foregoing conductive particles 31 increases the probability of contact between the conductive particles 31. This condition facilitates the electrical connection between the first electrode 12 and the second electrode 22 and between the first electrode 13 and the second electrode 23.

The aspect ratio of one of the conductive particles 31 is measured directly by using a method such as an observation under a CCD microscope. When one of the conductive particles 31 has a cross section other than a circle, the maximum width of the cross section is used as the length of the minor axis to obtain the aspect ratio. The conductive particles 31 are each not necessarily required to have a straight shape. Even when some of them are slightly bent or branched, they can be used without problems. In this case, the maximum length of them is used as the length of the major axis to obtain the aspect ratio.

It is desirable that the adhesive 30 be a film-shaped adhesive 30 in which the direction of the length L of the major axis of the individual conductive particles 31 is oriented toward the thickness direction X of the film-shaped adhesive 30 by passing the film-shaped adhesive 30 through a magnetic field applied in the thickness direction X of the film-shaped adhesive 30 at the time it is formed. This orientation further facilitates the electrical connection between the first electrode 12 and the second electrode 22 and between the first electrode 13 and the second electrode 23.

Figure 5:
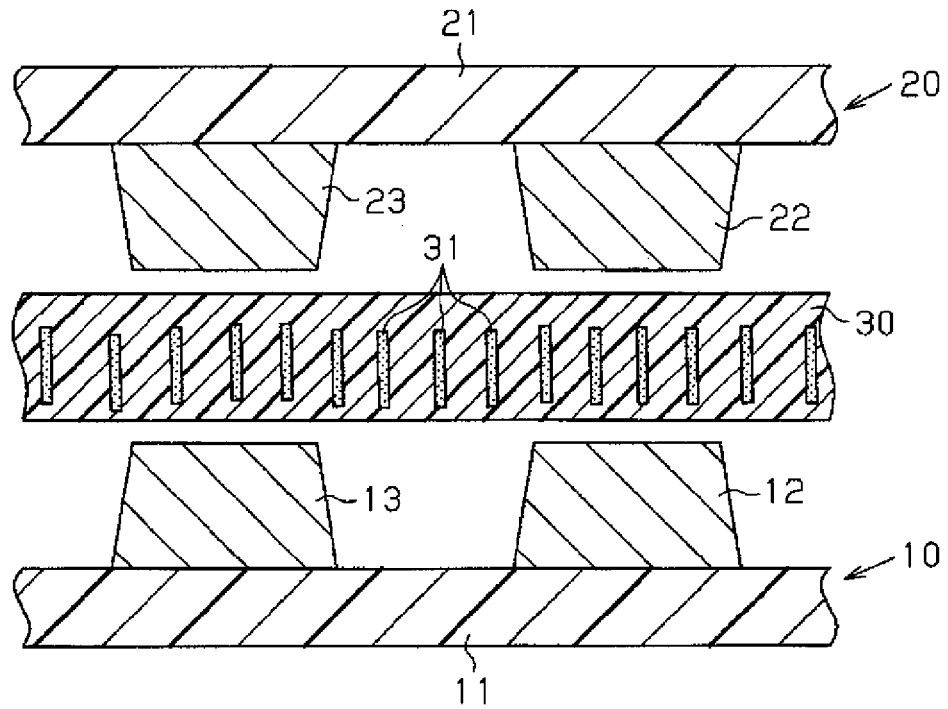
FIG. 5($a$) and FIG. 5($b$) are cross-sectional views for explaining the method of connecting printed wiring boards in an embodiment of the present invention.
Figure 5:
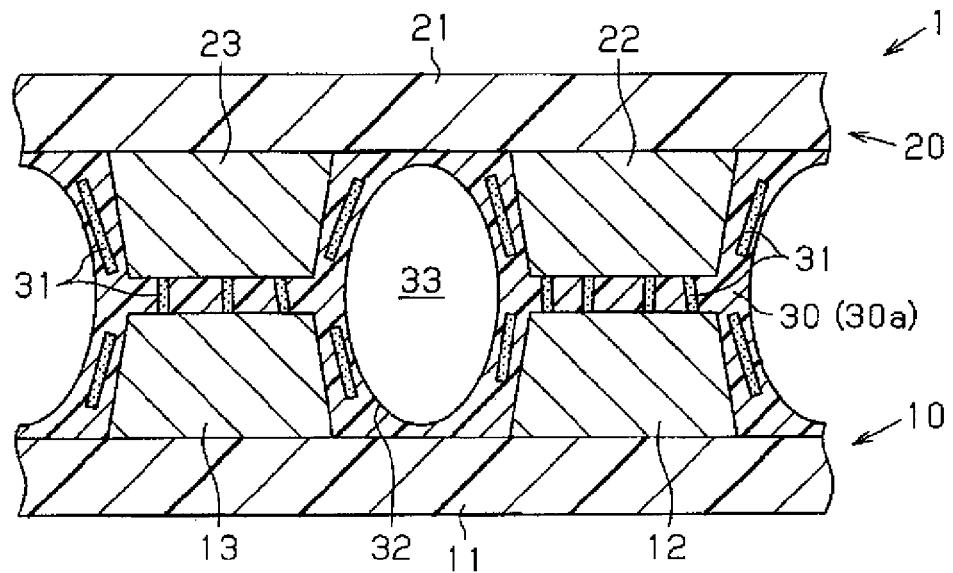

Next, an explanation is given to a method of producing the wiring-board-bonded body 1 having a structure in which the printed wiring boards 10 and 20 are connected together as shown in, for example, FIG. 1, that is, to a method of connecting the printed wiring boards 10 and 20, by referring to FIGS. 5(a) and 5(b). FIGS. 5(a) and 5(b) are cross-sectional views for explaining the method of the present invention for connecting the printed wiring boards 10 and 20.

First, as shown in FIG. 5(a), the first board 11, on which the first electrodes 12 and 13 are provided, and the second board 21, on which the second electrodes 22 and 23 are provided, are prepared. In addition, the adhesive 30 for forming the adhesive layer 30a is prepared.

Next, the adhesive 30 containing the conductive particles 31 is placed on the first board 11 having the first electrodes 12 and 13. The adhesive 30 is heated to a predetermined temperature (for example, 200° C.). It is pressed toward the direction of the first board 11 at a specified pressure (for example, 4 MPa) under the foregoing heated condition to tentatively bond it to the first board 11. The first board 11 and the second board 21 are placed so as to face each other to align the first electrodes 12 and 13 with the second electrodes 22 and 23. More specifically, not only are the first electrode 12 and the second electrode 22 placed so as to face each other in the thickness direction X but also the first electrode 13 and the second electrode 23 are placed so as to face each other in the thickness direction X to place the second board 21 on the adhesive 30. Thus, the adhesive 30 is positioned between the first board 11 and the second board 21. In other words, the adhesive 30 is positioned between the mutually facing first electrode 12 and second electrode 22 and between the mutually facing first electrode 13 and second electrode 23.

Figure 6:
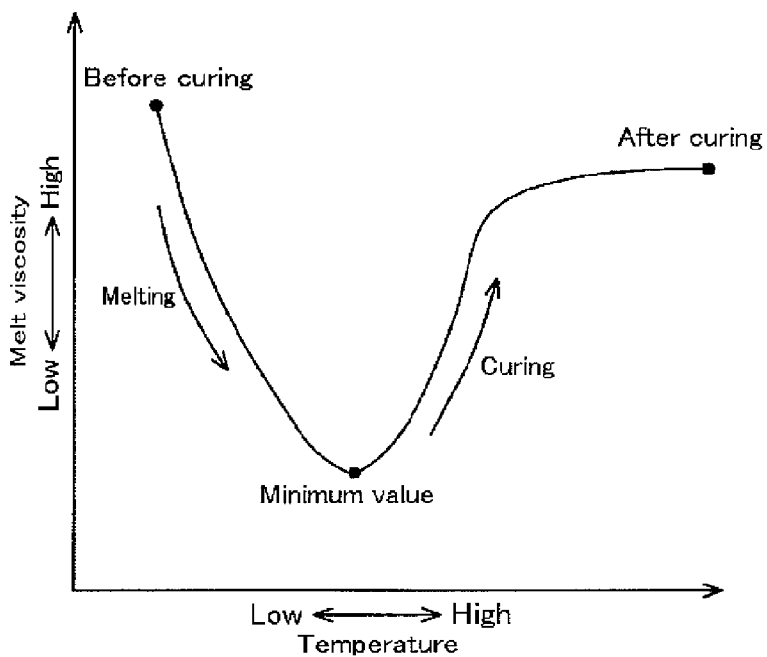
FIG. 6 is a graph for explaining the variation in the melt viscosity of an anisotropically conductive adhesive in an embodiment of the present invention.

Next, by using a pressure-connecting member (not shown), the adhesive 30 is pressed toward the direction of the first printed wiring board 10 at a specified pressure through the second printed wiring board 20. Under this condition, the adhesive 30 is heated and melted. The heating temperature is further increased to cure the adhesive 30. Thus, the adhesive layer 30a is formed. In other words, as described above, because the adhesive 30 contains the thermosetting resin as the main constituent, when the adhesive 30 is heated, the melt viscosity, first, decreases as shown in FIG. 6. Nevertheless, when the temperature is further increased, the adhesive 30 is cured. During the above process, when the adhesive 30 is melted, the gas existing in the space between the first board 11 and the second board 21 enters the interior of the molten adhesive 30. Then, the cavity portion 33 is formed in the adhesive layer 30a, which is formed by the cured adhesive 30. Finally, when the predetermined curing time for the adhesive 30 has elapsed, the heating condition given by the pressure-connecting member is terminated. Thus, the production of the wiring-board-bonded body 1 shown in FIG. 5(b) is completed.

This embodiment can accomplish the following effects:

(1) By heating and pressing the adhesive 30 placed between the mutually facing first electrodes 12 and 13 and second electrodes 22 and 23, the adhesive layer 30a is formed between the first board 11 and the second board 21 and in the adhesive layer 30a, the cavity portion 33 is formed between the multiple first electrodes 12 and 13 and between the multiple second electrodes 22 and 23. This structure can improve the insulating property between the first electrodes 12 and 13 and between the second electrodes 22 and 23, without providing, for example, a protruding insulating member (not shown) between the first electrodes 12 and 13 and between the second electrodes 22 and 23, which has been conventionally provided. As a result, the multiple first electrodes 12 and 13 and second electrodes 22 and 23 can be provided with a fine pitch. Furthermore, because the above-described cavity portion 33 is formed in the adhesive layer 30a, the conductive particles 31 included in the adhesive 30 are likely to gather in the location between the first electrodes 12 and 13 provided on the first board 11 and the second electrodes 22 and 23 provided on the second board 21. Consequently, the reliability in electrical connection between the first electrode 12 and the second electrode 22 and between the first electrode 13 and the second electrode 23 can be improved. As a result, this structure can combine the insulating property and the connection reliability.

(2) To the total area of the adhesive layer 30a and the cavity portion 33 both existing between the electrodes provided to be adjacent to each other in the cross section perpendicular to the thickness direction X, the area of the cavity portion 33 in the adhesive layer 30a has a ratio of 0.3 or more. Therefore, a large proportion of area is occupied by the cavity portion 33 in the area between the electrodes provided to be adjacent to each other along the surface direction Y shown in FIG. 2 (i.e., the area between the first electrodes 12 and 13 and between the second electrodes 22 and 23). As a result, this structure can reliably improve the insulating property between the first electrodes 12 and 13 and between the second electrodes 22 and 23. In addition, to the total area of the adhesive layer 30a and the cavity portion 33 both existing between the electrodes provided to be adjacent to each other in the cross section perpendicular to the thickness direction X, the area of the cavity portion 33 in the adhesive layer 30a has a ratio of 0.9 or less. Therefore, a large proportion of area is occupied by the adhesive 30 in the area between the electrodes provided to be adjacent to each other along the surface direction Y shown in FIG. 2. As a result, this structure can secure the bonding property between the first board 11 and the second board 21.

(3) The pitch P1 between the first electrodes and the pitch P2 between the second electrodes are 300 μm or less. As a result, the multiple first electrodes 12 and 13 and second electrodes 22 and 23 can be provided with a fine pitch, so that the electrodes on the individual printed wiring boards 10 and 20 can be provided with high density. Furthermore, because the pitch P1 between the first electrodes and the pitch P2 between the second electrodes are 10 μm or more, this structure can secure the width W1 and width W2 of the electrodes and the spacing S1 and spacing S2 between the neighboring two electrodes.

(4) The adhesive 30 not only covers the first electrodes 12 and 13 and the second electrodes 22 and 23 but also covers the first board 11 and the second board 21 at the positions between the first electrodes 12 and 13 and between the second electrodes 22 and 23. As a result, this structure can sufficiently secure the bonding property of the first board 11 and the first electrodes 12 and 13 with the second board 21 and the second electrodes 22 and 23.

(5) The conductive particles 31 constitute 0.0001 vol. % or more and 0.2 vol. % or less of the total volume of the adhesive 30. In other words, the concentration of the conductive particles 31 is low. This low concentration can improve the insulating property between the first electrodes 12 and 13 and between the second electrodes 22 and 23.

(6) The conductive particles 31 are a metal powder whose individual particle has either a shape in which a large number of fine metal particles are linked in the form of a linear chain or a needlelike shape. Consequently, while securing the insulating property between the first electrodes 12 and 13 and between the second electrodes 22 and 23, this structure can facilitate the electrical connection of the first electrodes 12 and 13 with the second electrodes 22 and 23.

(7) The conductive particles 31 each have an aspect ratio of 5 or more. This feature increases the probability of contact between the conductive particles 31. This condition can improve the connection reliability between the first electrodes 12 and 13 and the second electrodes 22 and 23 without increasing the quantity of use of the conductive particles 31.

(8) The adhesive 30 has the shape of a film. This feature not only facilitates the handling of the adhesive 30 but also improves the workability at the time the adhesive layer 30a is formed between the first board 11 and the second board 21 through the heating and pressing of the adhesive 30.

(9) The direction of the length of the major axis of the conductive particles 31 is oriented toward the thickness direction X of the adhesive 30, which has the shape of a film. Consequently, while securing the insulating property between the first electrodes 12 and 13 and between the second electrodes 22 and 23, this structure can further facilitate the electrical connection of the first electrodes 12 and 13 with the second electrodes 22 and 23.

(10) The adhesive 30 has a melt viscosity of 10 Pa·s or more and 10,000 Pa·s or less at 100° C. Because the adhesive 30 has a melt viscosity of 10,000 Pa·s or less at 100° C., when the adhesive layer 30a is formed by heating and pressing the adhesive 30, the gas bubble 32 tends to grow in the adhesive 30, so that a large cavity portion 33 is likely to be formed. In addition, because the adhesive 30 has a melt viscosity of 10 Pa·s or more at 100° C., when the adhesive layer 30a is formed by heating and pressing the adhesive 30, the gas forming the cavity portion 33 is less likely to escape from the interior of the adhesive 30. Consequently, when the heating and pressing are performed on the adhesive 30 placed between the first electrodes 12 and 13 and the second electrodes 22 and 23, this structure can facilitate the formation of the cavity portion 33 in the adhesive layer 30a.

(11) The adhesive 30 contains, as epoxy resin, a liquid epoxy resin having a viscosity of 0.1 Pa·s or more and 150 Pa·s or less at 25° C., and the liquid epoxy resin constitutes 30 mass % or more and 50 mass % or less of the total amount of the constituents of the adhesive 30. The adhesive 30 having the foregoing composition is suitable for exercising the effect described in (10) above. In other words, the adhesive 30 having the foregoing composition becomes the suitable adhesive 30 that can facilitate the forming of the cavity portion 33 in the adhesive layer 30a. As a result, the adhesive 30 can offer good insulating property between the first electrodes 12 and 13 and between the second electrodes 22 and 23 even in a high-temperature, high-humidity environment.

(12) In the method of the present invention for connecting the printed wiring boards 10 and 20, when the adhesive layer 30a is formed between the first board 11 and the second board 21, the cavity portion 33 is concurrently formed in the adhesive layer 30a. In other words, in the adhesive layer 30a formed between the first board 11 and the second board 21, the cavity portion 33 is formed between the multiple first electrodes 12 and 13 and between the multiple second electrodes 22 and 23. This structure can improve the insulating property between the first electrodes 12 and 13 and between the second electrodes 22 and 23, without providing a protruding insulating member between the first electrodes 12 and 13 and between the second electrodes 22 and 23, which has been conventionally provided. As a result, the multiple first electrodes 12 and 13 and second electrodes 22 and 23 can be provided with a fine pitch. Furthermore, because the above-described cavity portion 33 is formed in the adhesive layer 30a, the conductive particles 31 included in the adhesive 30 are likely to gather in the location between the first electrodes 12 and 13 provided on the first board 11 and the second electrodes 22 and 23 provided on the second board 21. Consequently, the reliability in electrical connection between the first electrode 12 and the second electrode 22 and between the first electrode 13 and the second electrode 23 can be improved. As a result, this structure can combine the insulating property and the connection reliability. In addition, because the cavity portion 33 is formed in the adhesive layer 30a concurrently with the formation of the adhesive layer 30a, this method can eliminate the necessity of another step for forming the cavity portion 33 in the adhesive layer 30a.

(13) The adhesive 30 of the present invention, which has anisotropic conductivity, has the physical property described in (10) or the constituent described in (11). Consequently, the adhesive 30 can be suitably used to concurrently form the cavity portion 33 in the adhesive layer 30a between the multiple first electrodes 12 and 13 and between the multiple second electrodes 22 and 23 at the time the adhesive layer 30a is formed between the first board 11 and the second board 21.

The present invention is not limited to the above-described embodiments. Various modifications in design may be performed based on the gist of the present invention. They are not eliminated from the scope of the present invention. For example, the above-described embodiments may be implemented by modifying them as described below.

Although in the above-described embodiments, the first printed wiring board 10 is a flexible wiring board, it may be a rigid wiring board. Similarly, the second printed wiring board 20 may be a rigid wiring board. When a rigid wiring board is used as the printed wiring board, the board may be formed by using a glass-epoxy-resin board or a glass board on which the wiring is formed.

EXAMPLE

The present invention is explained below based on Example and Comparative example. The present invention is not limited to Example described below. Example may be modified or altered based on the gist of the present invention.

The modified or altered designs are not eliminated from the scope of the present invention.

Example

Preparation of an Adhesive

An Ni powder was used as the conductive particles. More specifically, the conductive particles were formed of straight-chain fine nickel particles in which the length L of the major axis was distributed in the range of 3 to 20 μm and the length R of the minor axis was distributed in the range of 0.1 to 0.3 μm. The following epoxy resins, phenoxy resin, and curing agent were used:

Epoxy resin that is in a liquid state at 25° C.:
  (1) a bisphenol-A-type epoxy resin (made by Japan Epoxy Resins Co.; brand name: jER828EL; viscosity at 25° C.: 14 Pa·s),
  (2) a bisphenol-F-type epoxy resin (made by Japan Epoxy Resins Co.; brand name: jER807; viscosity at 25° C.: 4 Pa·s), and
  (3) a naphthalene-type epoxy resin (made by DIC Co.; brand name: EPICLON HP4032; viscosity at 25° C.: 100 Pa·s), Epoxy resin that is in a solid state at 25° C.:
  (4) a phenoxy resin (made by InChem. Co.; brand name: PKHH), and Curing agent:
  (5) an imidazole-based curing agent (made by ADEKA Co.; brand name: ADEKA HARDENER EH-4346S).

These constituents (1) to (5) were used with the following weight ratio: (1):(2):(3):(4):(5)=5:25:5:50:15. Consequently, in Example, the epoxy resins constitute 35 mass % of the total amount of the constituents. The epoxy resins, phenoxy resin, and curing agent were dissolved in 2-ethoxyethyl acetate. After they were dispersed, they were kneaded using three rolls to form a solution in which the solid portion represents 50 weight %. The foregoing Ni powder was added to the solution such that the metal-containing rate became 0.2 vol. %, the rate being expressed by the proportion in the total amount of the solid portion (the Ni powder and resin). The Ni powder was dispersed uniformly by agitating it using a centrifugal agitating mixer. Thus, a composite material for the adhesive was produced. The composite material was coated using a doctor knife on a PET film treated with a releasing agent. Then, the composite material was dried to be solidified at 60° C. for 50 minutes in a magnetic field having a magnetic flux density of 100 mT. This operation oriented the straight-chain particles in the film toward the direction of the magnetic field. Thus, an adhesive that has the shape of a film having a thickness of 35 μm and that has anisotropic conductivity was produced.

Measurement of Melt Viscosity

The melt viscosity at 100° C. of the produced adhesive was measured using a rheometer (Viscoanalyser VAR100 made by Reologica Instruments AB). More specifically, the produced adhesive was sandwiched between parallel circular disks having a diameter of 15 mm. While being vibrated at 1 Hz, the sample was heated from 20° C. up to 250° C. at a temperature-rising rate of 10° C./min to measure the viscosity. The result of the measurement of the melt viscosity showed that the adhesive in Example had a melt viscosity of 7,000 Pa·s at 100° C.

Measurement of Insulating Resistance

The following wiring boards were prepared: a flexible wiring board, which was a printed wiring board in which 100 gold-plated copper electrodes having a width of 100 μm, a length of 3 mm, and a height of 18 μm were arranged at a spacing of 100 μm; and a rigid wiring board, which was a printed wiring board in which 100 gold-plated copper electrodes having a width of 100 μm, a length of 3 mm, and a height of 18 μm were arranged at a spacing of 100 μm. In other words, two printed wiring boards having an electrode pitch of 200 μm were prepared. The produced adhesive was sandwiched between the flexible wiring board and the rigid wiring board. A press head, which was heated to a proper temperature (240° C.) in order to heat the adhesive to a specified temperature (200° C.), was placed above the flexible wiring board. The press head was moved toward the rigid wiring board to heat the adhesive to the specified temperature (200° C.) so that cavity portions could be formed in an adhesive layer formed by the adhesive. Concurrently, the press head applied a pressure of 4 MPa to the assembly for 10 seconds to perform the bonding, so that the mounting operation was completed. The foregoing operation produced a bonded body of the flexible wiring board and the rigid wiring board in which the electrodes were bonded with one another through the adhesive. The cavity portion in the adhesive layer had an area ratio of 0.4. Subsequently, the obtained bonded body was placed in an environment having a temperature of 85° C. and a humidity of 85% RH. Under this condition, a DC voltage of 15 V was applied continuously between electrodes adjacent to each other along the surface direction to measure the resistance, which is defined as the insulating resistance. The result is shown by a solid line in FIG. 7. The measurement of the insulating resistance was continued until the insulating resistance decreased and became unstable.

Comparative Example

An adhesive was produced by the same method as used in Example described above, except that no naphthalene-type epoxy resin was used, that the constituents (1), (2), (4), and (5) were prepared at a weight ratio of (1):(2):(4):(5)=6:17:67:10, and that the epoxy resins constituted 23 mass % of the total amount of the constituents. The melt viscosity was measured under the same condition as used in Example described above. The result showed that the adhesive in Comparative example had a melt viscosity of 15,000 Pa·s at 100° C. A bonded body was obtained by the same method as used in Example described above. No cavity portions were observed in the adhesive layer. Subsequently, the insulating resistance was measured under the same condition as used in Example described above. The result is shown by a chain double-dashed line in FIG. 7.

Figure 7:
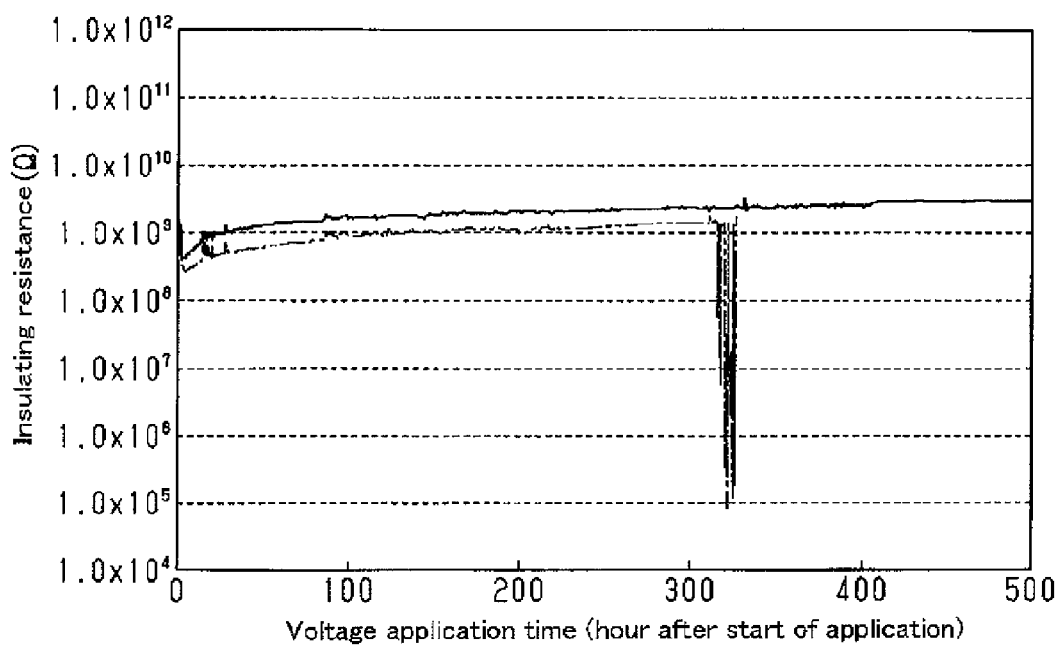
FIG. 7 is a graph showing the variation in the insulating resistance measured in Example and Comparative example.
Figure 8:
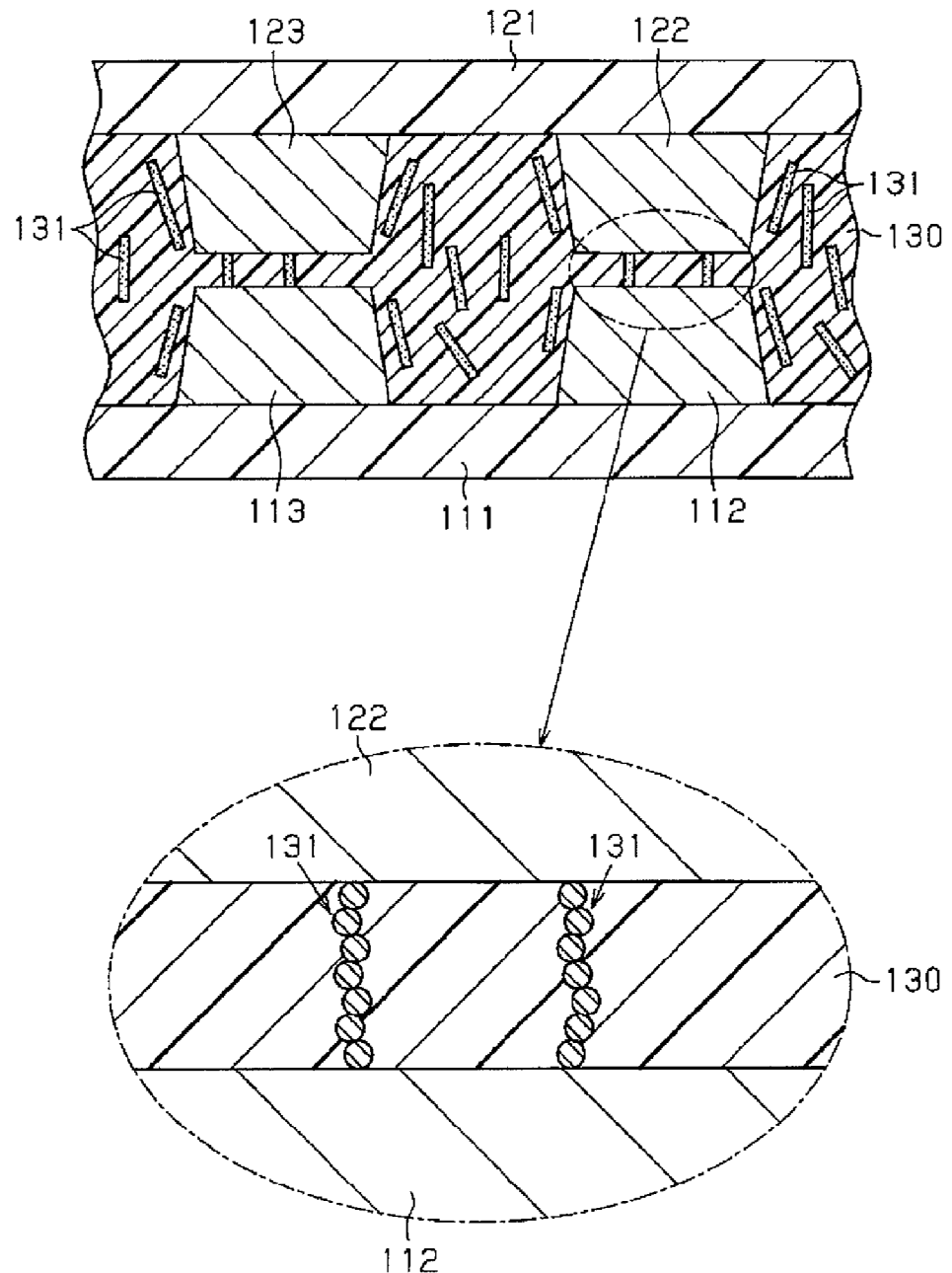
FIG. 8 is a cross-sectional view showing a conventional structure of connecting printed wiring boards.

FIG. 7 shows that in Example, even when a DC voltage of 15 V was applied continuously for 500 hours, the insulating resistance did not decrease noticeably. This result proves that the insulating property between the electrodes provided to be adjacent to each other is good even in a high-temperature, high-humidity environment. On the other hand, in Comparative example, FIG. 7 shows that after a 300-hour continuous application of a DC voltage of 15 V, the insulating resistance decreased noticeably and became unstable.

INDUSTRIAL APPLICABILITY

The examples of the application of the present invention include a wiring-board-bonded body having a structure of connecting printed wiring boards in which a plurality of electrodes provided to be adjacent to each other on each of the two boards are electrically connected mutually through an adhesive having anisotropic conductivity.

EXPLANATION OF THE SIGNS

X: Thickness direction; Y: Surface direction; 1: Wiring-board-bonded body; 10: First printed wiring board; 11: First board; 12 and 13: First electrodes; 20: Second printed wiring board; 21: Second board; 22 and 23: Second electrodes; 30: Adhesive; 30a: Adhesive layer; 31: Conductive particles; 32: Gas bubble; and 33: Cavity portion.

What is claimed is:

1. A structure of connecting printed wiring boards, the structure electrically connecting a plurality of first electrodes provided to be adjacent to each other on a first board with a plurality of second electrodes provided to be adjacent to each other on a second board through an adhesive that contains conductive particles and that has anisotropic conductivity; wherein:
   (a) the adhesive is placed between the first electrodes and the second electrodes, which face each other;
   (b) the adhesive is heated and pressed to form an adhesive layer between the first board and the second board; and
   (c) in the adhesive layer, a cavity portion is formed between the multiple first electrodes and between the multiple second electrodes,
   wherein the adhesive not only covers the first electrodes and the second electrodes but also covers the entire surface of the first board and the second board at positions between the first electrodes and between the second electrodes,
   wherein in a cross section obtained by cutting, in a direction perpendicular to the thickness direction, a region between the first electrodes and the second electrodes, which face each other in the thickness direction of the first board and the second board, when A1 represents a total area of the adhesive layer and the cavity portion both existing between the electrodes provided to be adjacent to each other along a surface direction, which is perpendicular to the thickness direction, and A2 represents an area of the cavity portion, the ratio of the area of the cavity portion to the total area, which is A2/A1, is 0.3 or more and 0.9 or less, and
   wherein the conductive particles constitute 0.0001 vol. % or more and 0.2 vol. % or less of the total volume of the adhesive.

2. The structure of connecting printed wiring boards as defined by claim 1, wherein the first electrodes have a pitch between them of 10 μm or more and 300 μm or less and the second electrodes have a pitch between them of 10 μm or more and 300 μm or less.

3. The structure of connecting printed wiring boards as defined by claim 1, wherein:
   (a) the conductive particles are a metal powder whose individual particle has one shape selected from the group consisting of a shape in which a large number of fine metal particles are linked in the form of a linear chain and a needlelike shape; and
   (b) the conductive particles each have an aspect ratio of 5 or more.

4. The structure of connecting printed wiring boards as defined by claim 1, wherein:
   (a) the adhesive has the shape of a film; and
   (b) the direction of the length of the major axis of the conductive particles is oriented toward the thickness direction of the adhesive, which has the shape of a film.

5. The structure of connecting printed wiring boards as defined by claim 1, wherein the adhesive has thermosetting property and has a melt viscosity of 10 Pa·s or more and 10,000 Pa·s or less at 100° C.

6. The structure of connecting printed wiring boards as defined by claim 1, wherein:
   (a) the adhesive contains, as essential constituents, epoxy resin, phenoxy resin, a curing agent, and conductive particles;
   (b) the epoxy resin is a liquid epoxy resin having a viscosity of 0.1 Pa·s or more and 150 Pa·s or less at 25° C.; and
   (c) the liquid epoxy resin constitutes 30 mass % or more and 50 mass % or less of the total amount of the constituents of the adhesive.

7. A structure of connecting printed wiring boards, the structure electrically connecting a plurality of first electrodes provided to be adjacent to each other on a first board with a plurality of second electrodes provided to be adjacent to each other on a second board through an adhesive that contains conductive particles and that has anisotropic conductivity; wherein:
   (a) the adhesive is placed between the first electrodes and the second electrodes, which face each other;
   (b) the adhesive is heated and pressed to form an adhesive layer between the first board and the second board; and
   (c) in the adhesive layer, a cavity portion is formed between the multiple first electrodes and between the multiple second electrodes, wherein
   (a) the adhesive contains, as essential constituents, epoxy resin, phenoxy resin, a curing agent, and conductive particles;
   (b) the epoxy resin is a liquid epoxy resin having a viscosity of 0.1 Pa·s or more and 150 Pa·s or less at 25° C.; and
   (c) the liquid epoxy resin constitutes 30 mass % or more and 50 mass % or less of the total amount of the constituents of the adhesive.

* * * * *